(12) United States Patent
Shin et al.

(10) Patent No.: US 9,096,797 B2
(45) Date of Patent: Aug. 4, 2015

(54) SILICATE PHOSPHOR, METHOD OF MANUFACTURING SILICATE PHOSPHOR, AND LIGHT-GENERATING DEVICE HAVING SILICATE PHOSPHOR

(75) Inventors: Myeong-Ju Shin, Seoul (KR); Seung-Hwan Baek, Seoul (KR); Yeong-Bae Lee, Bucheon-si (KR); Young-Sic Kim, Seoul (KR); Seok-Hyun Nam, Seoul (KR); Byung-Choon Yang, Seoul (KR); Jong-Su Kim, Busan (KR); Kwang-Won Park, Busan (KR); Yun-Hyoung Park, Seoul (KR); Ji-Su Yu, Uijeongbu-si (KR); Hyung-Seok Lim, Busan (KR)

(73) Assignees: SAMSUNG DISPLAY CO., LTD. (KR); PU-LYONG NATIONAL UNIVERSITY INDUSTRY—UNIVERSITY FOUNDATION (KR)

( * ) Notice: Subject to any disclaimer, the term of this patent is extended or adjusted under 35 U.S.C. 154(b) by 682 days.

(21) Appl. No.: 13/463,380

(22) Filed: May 3, 2012

(65) Prior Publication Data

US 2012/0223636 A1    Sep. 6, 2012

(30) Foreign Application Priority Data

Jun. 3, 2011    (KR) .................... 10-2011-0053918

(51) Int. Cl.
| | | |
|---|---|---|
| C09K 11/55 | (2006.01) | |
| C09K 11/59 | (2006.01) | |
| C09K 11/77 | (2006.01) | |
| H01L 33/50 | (2010.01) | |

(52) U.S. Cl.
CPC ......... *C09K 11/7721* (2013.01); *C09K 11/7774* (2013.01); *C09K 11/7792* (2013.01); *H01L 33/502* (2013.01); *Y02B 20/181* (2013.01)

(58) Field of Classification Search
CPC ............. H01L 33/502; C09K 11/7721; C09K 11/7774; C09K 11/7792

USPC ......... 252/301.4 F, 301.6 F; 313/503; 257/98
See application file for complete search history.

(56) References Cited

U.S. PATENT DOCUMENTS

| | | | |
|---|---|---|---|
| 6,982,045 B2 | 1/2006 | Menkara et al. | |
| 7,682,525 B2 * | 3/2010 | Liu et al. ................. | 252/301.4 F |
| 2006/0011936 A1 * | 1/2006 | Hiramatsu et al. ............ | 257/100 |
| 2009/0085467 A1 | 4/2009 | Jang et al. | |

FOREIGN PATENT DOCUMENTS

| | | |
|---|---|---|
| CN | 101448915 | 6/2009 |
| JP | 2005-330348 | 2/2005 |
| KR | 100891020 B1 | 3/2009 |

OTHER PUBLICATIONS

He, Dawei; VUV Luminescent Properties of M2 SiO4 :Re (M=Mg Ca Ba) (Re=Ce3+Tb3+),Chinese Journal of Luminescence, vol. 28, No. 1, Article ID: 1000 7032 (2007) 01 0053 04; 4pages, Feb. 2007.

* cited by examiner

*Primary Examiner* — Carol M Koslow
(74) *Attorney, Agent, or Firm* — Innovation Counsel LLP

(57) ABSTRACT

A silicate phosphor composition is provided having a γ-phase of an orthorhombic crystal structure whose space group is Pbnm 62, and whose composition is represented by the following chemical formula:

$$Ca_{2-x-y-z}M_xSiO_4{:}yCe^{3+},zN (0 \le x < 0.5, 0 < y \le 0.1, 0 \le z < 0.15)$$

In the formula, M represents at least one member selected from the group consisting of Mg, Sr, Ba, Zn, Na, Al, Ga, Ge, P, As and Fe, and N represents at least one member selected from the group consisting of $Eu^{2+}$, $Mn^{2+}$, $Tb^{3+}$, $Yb^{2+}$ and $Tm^{3+}$. The silicate phosphor has a maximum absorbance for a wavelength of about 450 nm to about 475 nm corresponding to a main part of a blue excitation light, and has a great stability at a high temperature. As such the silicate phosphor may be used in combination with a blue light source to produce a white light.

19 Claims, 6 Drawing Sheets

SILICATE PHOSPHOR, METHOD OF MANUFACTURING SILICATE PHOSPHOR, AND LIGHT-GENERATING DEVICE HAVING SILICATE PHOSPHOR

PRIORITY STATEMENT

This application claims priority under 35 U.S.C. §119 to Korean Patent Application No. 10-2011-0053918, filed on Jun. 3, 2011 in the Korean Intellectual Property Office (KIPO), the contents of which application are herein incorporated by reference in their entirety.

BACKGROUND

1. Field of Disclosure

The present disclosure of invention relates to a silicate phosphor composition, a method of manufacturing the silicate phosphor and a light-generating device having the silicate phosphor. More particularly, example embodiments in accordance with the present disclosure relate to a silicate phosphor composition that may be used for generating a white light, a method of manufacturing the silicate phosphor composition and a light-generating device having the silicate phosphor composition disposed therein.

2. Description of Related Technology

Recently, a class of white light emitting diodes (wLED's) have been developed which have relatively small power consumption, small volume and light weight, and these are being widely used for example as a light source of an illumination device and as a backlighting source for liquid crystal display devices.

Such a wLED for generating a white light conventionally includes a blue light-emitting element (e.g., semiconductive element) where the latter has a yellow phosphor coated thereon. A blue light having one or more wavelengths in the range of about 450 nm to about 475 nm is emitted by the blue light-emitting element. This blue light output is mixed with a yellow light of about 560 nm emitted by the yellow phosphor to thus form a white light. Examples of the conventional yellow light emitting phosphor include a YAG($Y_3Al_5O_{12}$: $Ce^{3+}$)-based phosphor composition, a BOS(($Ba,Sr,Ca)_2SiO_4$: $Eu^{2+}$)-based phosphor composition and a nitride/nitric-based phosphor composition.

However, the yellow light emitted by the YAG-based phosphor has insufficient green intensity and insufficient red intensity in its emission spectrum so that continuity of the resultant white light is low. Furthermore, emission luminance of the BOS-based phosphor is reduced at elevated temperatures, and emission color of BOS-based phosphor is changed at elevated temperatures thus causing the latter to have temperature-varied performance.

Furthermore, the manufacturing processes for making the nitride/nitric-based phosphor are performed at a high temperature and under a high pressure so that expensive devices are required for manufacturing the nitride/nitric-based phosphor. Furthermore, size control, separation and grinding for particles are not easy so that a yield ratio of the latter is low.

SUMMARY

Example embodiments in accordance with the present disclosure of invention provide a silicate phosphor that has a relatively high green and red emission efficiency in response to an excitational blue light, whereby a good quality white light can result as an output combination. Additionally, the silicate phosphor composition maintains a stable emission luminance at high temperatures, and has a relatively small color variation in response to temperature change, and it may be easily manufactured through simple processes.

Example embodiments of the present disclosure of invention further provide a method of manufacturing the silicate phosphor.

Example embodiments of the present disclosure of invention further provide a light-emitting device having the silicate phosphor.

According to one aspect of the present disclosure, a silicate phosphor has a γ-phase of an orthorhombic crystal structure whose space group is Pbnm 62, and whose composition is represented by the following Chemical Formula 1.

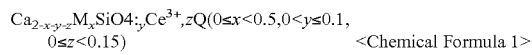

$Ca_{2-x-y-z}M_xSiO4{:}_yCe^{3+}{,}zQ(0{\leq}x{<}0.5, 0{<}y{\leq}0.1, 0{\leq}z{<}0.15)$  <Chemical Formula 1>

In Chemical Formula 1, M represents at least one member selected from the group consisting of Mg, Sr, Ba, Zn, Na, Al, Ga, Ge, P, As and Fe, and Q represents at least one member selected from the group consisting of Eu2+, Mn2+, Tb3+, Yb2+ and Tm3+.

In an example embodiment, a content of Ca may be about 1.25 mole to about 2 mole relative to one mole of $SiO_4$.

In an example embodiment, a powder diffraction pattern of the silicate phosphor may coincide with JCPDS standard #76-0799, #77-0387, #86-0397, #87-1256, #87-1257 or #83-2457.

In an example embodiment, a mole content of $Ce^{3+}$ may be about 0.01 mole to about 0.03 mole relative to one mole of $SiO_4$.

According to another aspect of the present disclosure of invention, a method of manufacturing a silicate phosphor is provided. According to the method, a raw-material mixture including a Ca-containing compound, a Si-containing compound and a Ce-containing compound is prepared. The raw-material mixture is sintered. The sintered raw-material mixture is cooled to obtain a solidified silicate phosphor having a γ-phase of an orthorhombic crystal structure whose space group is Pbnm 62, and whose composition is represented by the Chemical Formula 1.

In an example embodiment, the Ca-containing compound includes at least one member selected from the group consisting of CaO, $CaCO_3$, $Ca(NO_3)_2$, $CaF_2$ and $CaCl_2$, and the Si-containing compound includes at least one member selected from the group consisting of $SiO_2$, SiO and Si, and the Ce-containing compound includes at least one member selected from the group consisting of $Ce_2O_3$, $CeO_2$, $Ce_2(SO_4)_3$ and $Ce(SO_4)_2$.

In an example embodiment, the raw-material mixture further includes at least one compound containing Mg, Sr, Ba, Zn, Na, Al, Ga, Ge, P, As or Fe, and further includes at least one compound containing Eu, Mn, Tb, Yb or Tm.

In an example embodiment, the raw-material mixture further includes a flux including at least one member selected from the group consisting of $MgF_2$, $MgCl_2$, $BaF_2$, $BaCl_2$, $SrF_2$, $SrCl_2$, $CaF_2$, $CaCl_2$, $NH_4F$, $NH_4Cl$ and LiF.

In an example embodiment, the raw-material mixture may be sintered at about 1,350° C. to about 1,550° C.

In an example embodiment, the raw-material mixture may be sintered in a reducing atmosphere including a hydrogen gas.

In an example embodiment, the raw-material mixture may be sintered under a pressure of about 0.05 atm to about 2.5 atm.

In an example embodiment, the sintered raw-material mixture may be cooled by a speed of no less than about 15° C./min.

In an example embodiment, the sintered raw-material mixture may be cooled to have a temperature less than about 25° C.

In an example embodiment, the sintered raw-material mixture may be cooled by a speed of no less than about 45° C./min.

In an example embodiment, the solidified silicate phosphor may be crushed to produce smaller particles of the solidified silicate phosphor.

According to still another aspect of the present disclosure of invention, a light-emitting device includes a light source generating a light; and a silicate phosphor excited by the light to emit a light having a wavelength longer than the light generated by the light source, the silicate phosphor having a γ-phase of an orthorhombic crystal structure whose space group is Pbnm 62, and whose composition is represented by the Chemical Formula 1.

In an example embodiment, the light source may include an LED generating a blue light.

In an example embodiment, the silicate phosphor may emit at least one selected from the group consisting of a yellow light, a green light and a yellowish red light.

In an example embodiment, the light generated by the light source is combined with the light emitted by the silicate phosphor thereby forming a white light.

In an example embodiment, the light-emitting device may further include a sealing member having attached thereto or distributively embedded therein the silicate phosphor, where the sealing member sealingly covers the light source.

According to one aspect the present teachings, the silicate phosphor has a maximum absorbance for a wavelength of about 450 nm to about 475 nm corresponding to a main part of the excitation light, and has a great stability at a high temperature. Thus, the silicate phosphor has a high emission efficiency, and a luminance at a high temperature more than about 200° C. may be maintained to be more than about 60% when a luminance at a room temperature is defined as 100%.

Furthermore, a doping ratio of the activator to the host lattice in the silicate phosphor composition may be adjusted, or a metal that is not Ca may be substituted for a host lattice thereof, so that the light-emitting device including the silicate phosphor may generate various types of white lights including from a warm white light to a cold white light.

BRIEF DESCRIPTION OF THE DRAWINGS

The above and other features and advantages of embodiments in accordance with the present disclosure will become more apparent by describing in detailed examples thereof with reference to the accompanying drawings, in which.

DETAILED DESCRIPTION

Figure 1:
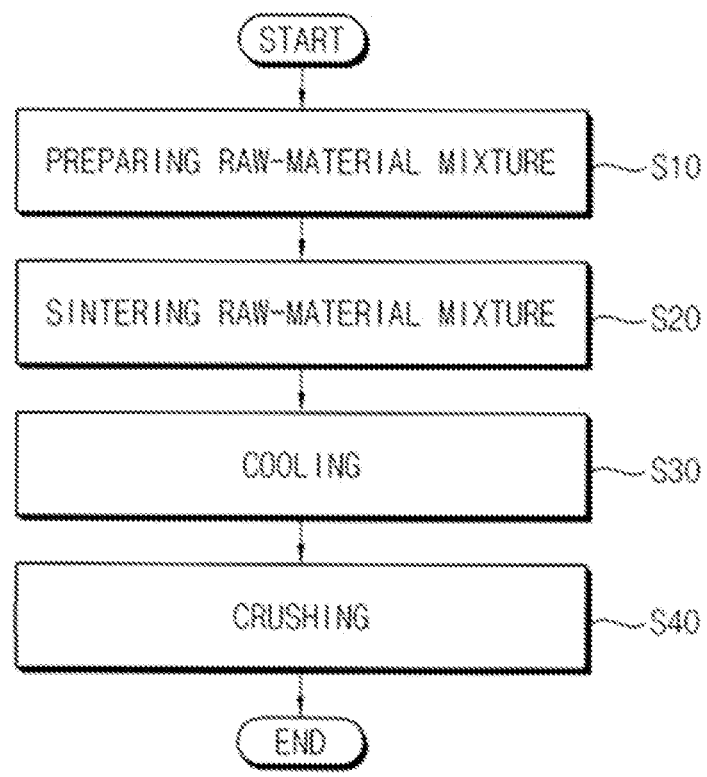
FIG. 1 is a flow chart for explaining a method of manufacturing a silicate phosphor according to an example embodiment.

Hereinafter, the present disclosure of invention will be explained in detail with reference to the accompanying drawings.

Silicate Phosphor

A silicate phosphor according to an example embodiment of the present disclosure has a γ-phase of an orthorhombic crystal structure with a Pbnm 62 space group, and it is represented by the following Chemical Formula 1.

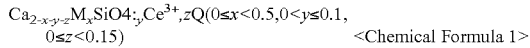

$Ca_{2-x-y-z}M_xSiO_4{:}_yCe^{3+},zQ(0\leq x<0.5, 0<y\leq 0.1, 0\leq z<0.15)$  <Chemical Formula 1>

In Chemical Formula 1, M represents at least one member selected from the group consisting of Mg, Sr, Ba, Zn, Na, Al, Ga, Ge, P, As and Fe, and Q represents at least one member selected from the group consisting of Eu2+, Mn2+, Tb3+, Yb2+ and Tm3+.

In the silicate phosphor microstructure, the Ca, M and SiO$_4$ components form a host lattice. Thus, the host lattice essentially includes Ca, and optionally includes at least two metals including Ca. In the silicate phosphor, a content of Ca is preferably about 1.25 mole to about 2 mole with respect to 1 mole of SiO$_4$. When the content of Ca is less than 1.25 mole or greater than 2 mole relative to the mole of SiO$_4$, the orthorhombic structure may be changed to a monoclinic structure, a hexagonal structure, or the like, and the silicate phosphor may have α, β, χ or T phases, which are different from the desired γ-phase. Furthermore, an emission efficiency and a luminance at a high temperature may be decreased with respect to an excitation light having a wavelength of about 450 nm to about 475 nm. More preferably, the content of Ca may be about 1.5 mole to about 2 mole relative to the mole of SiO$_4$.

In the silicate phosphor, Ce$^{3+}$ and N serve as an activator (or a co-activator), and are doped into the host lattice. For example, Ce$^{3+}$ is excited by an excitation light to emit yellow light, for example, of which a wavelength is near 560 nm. When N includes Eu$^{2+}$, the silicate phosphor may further emit a green light, for example, one whose wavelength is near 500 nm. When N includes Mn$^{2+}$, the silicate phosphor may further emit a yellowish red light, for example, one whose wavelength is near 620 nm. Thus, the silicate phosphor according to an example embodiment of the present disclosure may emit a green light and a yellowish red light as well as a yellow light. Therefore, a white light formed by using the silicate phosphor may have a relatively high continuity (e.g., a substantially flattened spectrum).

A crystal structure of the silicate phosphor may be confirmed by comparing with a powder diffraction pattern of a standard material according to JCPDS (the Joint Committee on Powder Diffraction Standards). For example, a powder diffraction pattern of the silicate phosphor may coincide with JCPDS standard #76-0799, #77-0387, #86-0397, #87-1256, #87-1257, or #83-2457.

Furthermore, the silicate phosphor according to an example embodiment of the present disclosure has a substantially maximum absorbance for a wavelength of about 450 nm to about 475 nm corresponding to a main part of the blue excitation light, and has a great stability at a high temperature. Thus, the silicate phosphor has a high emission efficiency, and a luminance at a high temperature more than about 200°

C. may be maintained to be more than about 60% when a luminance at a room temperature is defined as 100%.

Furthermore, Mg, Ca, Sr, Ba, Zn, Na, Al, Ga, Ge, P, As, Fe or the like may be substituted for a portion of Ca in the host lattice, and a doping rate of $Ce^{3+}$, $u^{2+}$, $Mn^{2+}$, $Tb^{3+}$, $Yb^{2+}$ and $Tm^{3+}$ may be adjusted so that various white lights including from a warm white light to a cold white light may be selectively generated.

Method of Manufacturing Silicate Phosphor

FIG. 1 is a flow chart for explaining a method of manufacturing a silicate phosphor according to an example embodiment.

Referring to FIG. 1, a raw-material mixture is prepared (S 10). The raw-material mixture may include a host-lattice compound including a host-lattice element, and an activator compound including an activator element. For example, the raw-material mixture may include an oxide, a carbide, a nitride, a phosphide, a metal and the like, and a sintering process is preferably in a reducing atmosphere so as to reduce the raw-material mixture.

Examples of a Ca-containing compound for the raw-material mixture may include CaO, $CaCO_3$, $Ca(NO_3)_2$, $CaF_2$, $CaCl_2$, and the like. Examples of a Ba-containing compound for the raw-material mixture may include BaO, $BaCO_3$, $Ba(NO_3)_2$, $BaF_2$, $BaCl_2$, and the like. Examples of a Si-containing compound for the raw-material mixture may include $SiO_2$, SiO, Si and the like. Examples of a Ce-containing compound for the raw-material mixture may include $Ce_2O_3$, $CeO_2$, $Ce_2(SO_4)_3$, $Ce(SO_4)_2$ and the like. Examples of an Eu-containing compound for the raw-material mixture may include $Eu_2O_3$, $Eu_2(CO_3)_3$, $Eu(NO_3)_3$ and the like. Examples of a Mn-containing compound for the raw-material mixture may include MnO, $MnCO_3$, $Mn(NO_3)_2$ and the like. Furthermore, the raw-material mixture may include well-known compounds containing Mg, Sr, Zn, Na, Al, Ga, Ge, P, As or Fe, which may be used for the host lattice, and containing Tb, Yb or Tm, which may be used for the activator.

Relative proportional contents of the host-lattice compound and the activator compound of the raw-material mixture are determined depending on the desired mole ratios of elements of Chemical Formula 1 and proportional member constituency in the respective raw materials. For example, when the host-lattice compound includes $CaCO_3$ and $SiO_2$, and when the activator compound includes $CeO_2$, contents of the compounds are determined such that the relative mole ratios of $CaCO_3$, $SiO_2$ and $CeO_2$ is 2-y:1:y respectively. The host-lattice compound and the activator compound are mixed and grinded, for example, through a ball milling method so that the compounds may be uniformly dispersed in the raw-material mixture.

Furthermore, a flux material such as $MgF_2$, $MgCl_2$, $BaF_2$, $BaCl_2$, $SrF_2$, $SrCl_2$, $CaF_2$, $CaCl_2$, $NH_4F$, $NH_4Cl$, LiF or the like is preferably added to the mixture of the host-lattice compound and the activator compound prior to heating. Since a melting temperature of the flux is lower than a synthesis temperature for crystal growth of the silicate phosphor, the flux is melted earlier during heat up than other compounds in the raw-material mixture thereby improving flexibility or liquidity of the raw-material mixture to improve crystal nucleation and crystal growth of the silicate phosphor. Thus, a process temperature and a required time may be reduced. Furthermore, an activator may be uniformly distributed in the silicate phosphor, and a size distribution of phosphor particles may be uniform.

Furthermore, the flux is melted earlier than other compounds in the raw-material mixture thereby 3-dimensionally surrounding the raw-material mixture and isolating it from an ambient atmosphere. Thus, vaporization of the raw-material mixture may be prevented or reduced. Furthermore, an anion of the flux may compensate for an oxygen defect generated in a reducing atmosphere so that a desired chemical equivalent of the silicate phosphor is easily adjusted and produced.

Thereafter, the raw-material mixture is sintered to form the silicate phosphor (S 20). For example, the raw-material mixture may be sintered in a melting pot disposed in a furnace. The raw-material mixture may be sintered preferably in a reducing atmosphere to reduce $Ce^{4+}$ to $Ce^{3+}$ because $Ce^{4+}$ is more stable than $Ce^{3+}$. For example, the reducing atmosphere may include a nitrogen gas $N_2$, which is an inert gas, and a hydrogen gas $H_2$, which functions as a reducing gas. Particularly, the reducing atmosphere may include a $H_2/N_2$ mixture gas having a corresponding mixture ratio of about 5%. Furthermore, the raw-material mixture may be sintered under a pressure of about 0.05 atm to about 2.5 atm.

A sintering temperature for the raw-material mixture is preferably about 1,350° C. to about 1,550° C. When the sintering temperature is lower than 1,350° C. or higher than 1,550° C., crystals having α, β, χ or T phases are undesirably formed so that the silicate phosphor cannot have a substantially homogeneous γ-phase of an orthorhombic crystal microstructure. When the silicate phosphor includes crystals of α, β, χ or T phases mixed with crystals of a γ-phase, an emission efficiency of the formed composition for a wavelength of about 450 nm to about 475 nm corresponding to a main part of the excitation light may be reduced, and a stability at a high temperature may be reduced due to deformation of a crystal structure.

For example, the raw-material mixture may be sintered for about 1 hour to about 6 hours, and a time required for increasing a process temperature (ramping up) from a room temperature (about 25° C.) to the highest temperature of about 1,350° C. to about 1,550° C. may be about 1 hour to about 6 hours.

Thereafter, the sintered raw-material mixture is cooled to solidify and crystallize and thus form the silicate phosphor composition having a γ-phase of an orthorhombic crystal structure with the corresponding space group being Pbnm 62 (S 30).

The manufactured silicate phosphor has a composition substantially the same as the previously explained silicate phosphor. Particularly, the manufactured silicate phosphor is substantially represented by the following Chemical Formula 1.

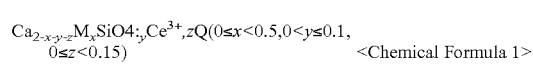

$Ca_{2-x-y-z}M_xSiO4:_yCe^{3+},zQ(0≤x<0.5, 0<y≤0.1, 0≤z<0.15)$ <Chemical Formula 1>

In Chemical Formula 1, M represents at least one member selected from the group consisting of Mg, Sr, Ba, Zn, Na, Al, Ga, Ge, P, As and Fe, and Q represents at least one member selected from the group consisting of Eu2+, Mn2+, Tb3+, Yb2+ and Tm3+.

In the present example embodiment, the raw-material mixture may be quickly cooled to form the crystallized silicate phosphor having the γ-phase. Preferably, the raw-material mixture may be cooled such that during ramp down the temperature is reduced by a rate no less than about 15° C./min. More preferably, in order to increase possibility to obtain the silicate phosphor having a γ-phase of an orthorhombic structure, the temperature is reduced by no less than about 45° C./min such that a time required for reducing the temperature from about 1,400° C. to the room temperature is less than about 30 minutes. When a time required for reducing the highest temperature from about 1,400° C. to the room temperature is more than about 3 hours, crystals of α, β, χ or T phases are undesirably formed so that the manufactured silicate phosphor does not have a substantially homogeneous γ-phase of an orthorhombic structure.

Furthermore, the raw-material mixture is preferably cooled during ramp down such that the end point temperature is less than the room temperature. When the raw-material mixture is taken out of the furnace with having a temperature more than the room temperature, a peripheral oxygen gas may be undesirably absorbed to partially oxidize the formed composition so that $Ce^{3+}$ is changed to $Ce^{4+}$ thereby causing reduction of luminance.

Thereafter, the sintered silicate phosphor is crushed (S 40). For example, the silicate phosphor particles formed by crushing may have application-appropriate sizes. If the size of the silicate phosphor particle is made excessively small, an excited light and an incident light are excessively scattered so that an emission efficiency is reduced, and when the size of the silicate phosphor particle is excessively large, an excited light and an incident light are not transmitted so that an emission efficiency is reduced. The optimum size may be empirically determined. In one embodiment, the size of the crushed silicate phosphor particles is preferably in the range of about 5 um to about 12 um.

Thus, according to an example embodiment, a raw-material mixture for a silicate phosphor is sintered at a specific temperature and is quickly cooled to form the silicate phosphor having a γ-phase of orthorhombic structure with space group Pbnm 62.

Light-Emitting Device

Figure 2:
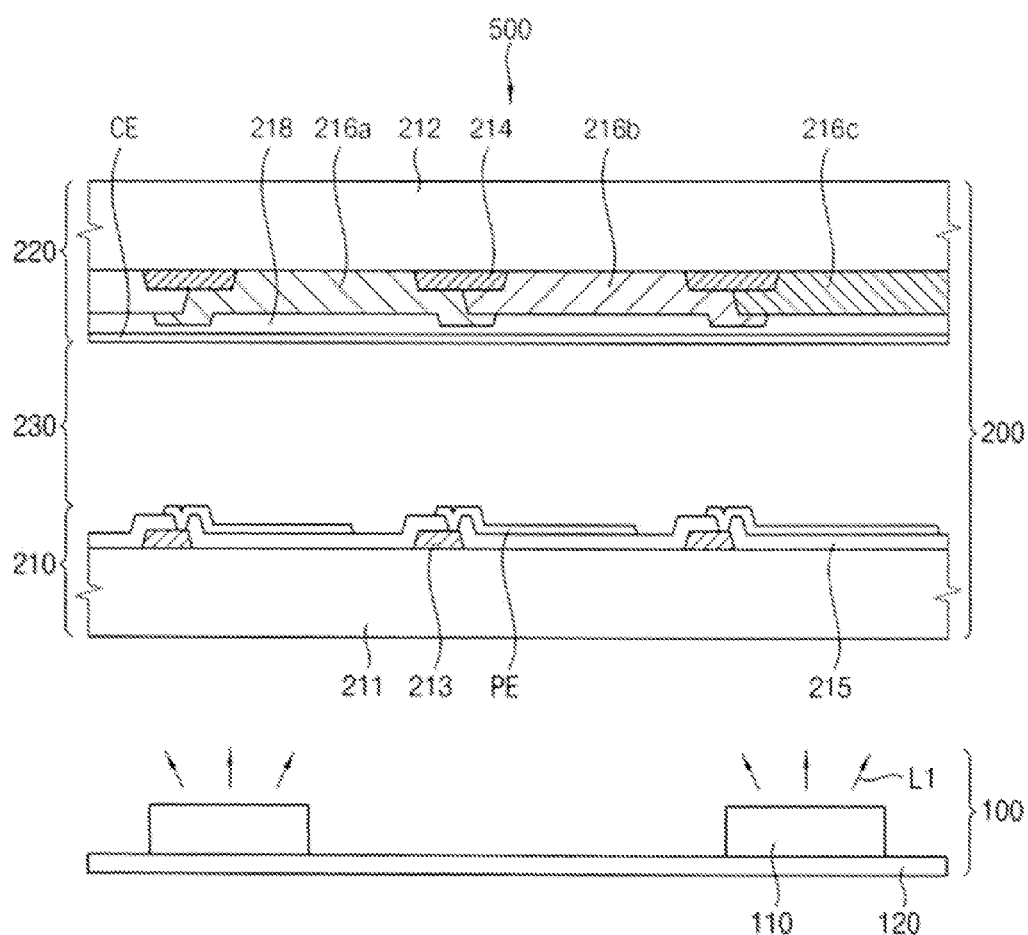
FIG. 2 is a cross-sectional view illustrating a display device including a light-emitting device according to an example embodiment.
Figure 3:
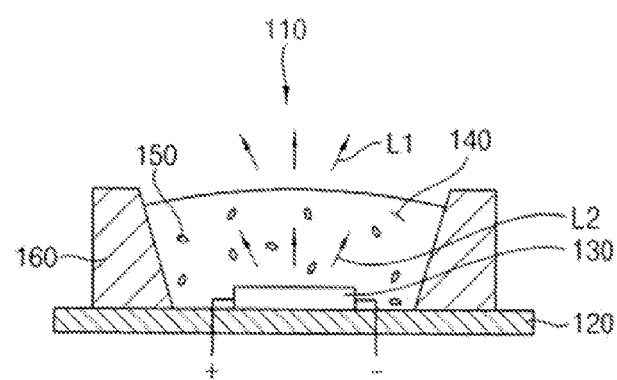
FIG. 3 is an enlarged cross-sectional view illustrating the light-emitting device of FIG. 2.

FIG. 2 is a cross-sectional view illustrating a display device including in its backlighting unit a light-emitting device according to an example embodiment of the present disclosure. FIG. 3 is an enlarged cross-sectional view illustrating the light-emitting device of FIG. 2.

Referring to FIG. 2, a display device 500 includes a light-providing assembly 100 (backlighting unit) and a display panel 200. The light-providing assembly 100 includes a substrate 120 and one or more light-emitting devices 110 mounted on the substrate 120. The light-providing assembly 100 may further include at least one optical sheet (not shown) disposed between the light-emitting devices 110 and the display panel 200. The optical sheet diffuses and condenses a light generated by the light-emitting devices 110 to provide the light in a more uniform way to the display panel 200. In an example embodiment, conventional optical sheets of the art may be used for the optical sheets.

The display panel 200 includes a first substrate 210, a second substrate 220 and a liquid crystal layer 230 interposed between them. The display panel 200 uses a light L1 provided by the light-providing assembly 100 to display an image. For example, the light-emitting devices 110 emit a white light. The second substrate 220 faces the first substrate 210, and the liquid crystal layer 230 is disposed between the first and second substrates 210 and 220.

The first substrate 210 includes a plurality of switching elements 213 (e.g., transistors), a passivation layer 215 for protecting the switching elements 213 and a plurality of pixel electrodes PE electrically connected to respective ones of the switching elements 213 via corresponding contact holes formed through the passivation layer 215. The switching elements 213 are formed on a first base substrate 211 and they control respective turning on/off of respective pixel cells. In one embodiment, each switching element 213 includes a control electrode (gate), an input electrode (source) and an output electrode (drain), which are electrically connected to signal lines of the first substrate 210. The output electrode of the switching element 213 is electrically connected to the pixel electrode PE.

The second substrate 220 includes a light-blocking pattern 214 (a.k.a. black matrix), a plurality of differently colored color filters 216a, 216b and 216c (e.g., red, green and blue), an overcoating layer 218 and a common electrode CE, which are formed on a second light-passing and base substrate 212. The light-blocking pattern 214 may be formed to overlap with the switching elements 213 and the signal lines. The color filters 216a, 216b and 216c may be formed to face the pixel electrode PE. The color filters 216a, 216b and 216c may include a first color filter 216a representing a red, a second color filter 216b representing a green and a third color filter 216c representing a blue. The overcoating layer 218 may be omitted so that common electrode may make contact with the color filters 216a, 216b and 216c. Furthermore, the color filters 216a, 216b and 216c may not be formed on the second substrate 210, but rather formed on the first substrate 210.

Referring to FIG. 3, each of the light-emitting devices 110 is formed on the substrate 120, and includes a light source 130 generating an excitation light (L2, e.g., blue light), a sealing member 140 covering the light source, particles of a silicate phosphor 150 disposed within the sealing member 140 so as to be excited by the excitation light L2 generated by the light source 130 and to thus emit a light having a wavelength different from that of the excitation light L2, and a wall 160 forming a space for receiving the light source 130 and the sealing member 140.

The substrate 120 may be a printed circuit board. Alternatively, the substrate 120 may be a lead frame, a heat sink or a plastic package body, and is not limited thereto.

The sealing member 140 covers the light source 130 to protect the light source 130, and may include an epoxy resin.

In the present example embodiment, the light source 130 is a light-emitting diode (LED). For example, the LED may be manufactured by forming a semiconductor layer on a base substrate including, for example, sapphire, SiC, spinel or the like. For example, the semiconductor layer of the LED may include gallium nitride (GaN), indium gallium nitride (InGaN) or the like.

For example, the LED emits the excitation light L2 including an ultraviolet ray wavelength and/or a blue light wavelength. Preferably, the excitation light L2 may have a wavelength of about 400 nm to about 500 nm, and may have its maximum output intensity in a range of about 450 nm to about 475 nm.

The silicate phosphor 150 is substantially the same as the previously explained silicate phosphor composition according to example embodiments of the present disclosure. Particularly, the silicate phosphor 150 has a γ-phase of an orthorhombic crystal structure with the space group being Pbnm 62, and the composition is represented by the following Chemical Formula 1.

$$Ca_{2-x-y-z}M_xSiO_4:yCe^{3+},zN (0 \leq x < 0.5, 0 < y \leq 0.1, 0 \leq z < 0.15)$$ 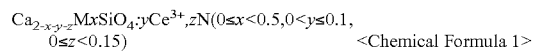 <Chemical Formula 1>

In Chemical Formula 1, M represents at least one member selected from the group consisting of Mg, Sr, Ba, Zn, Na, Al, Ga, Ge, P, As and Fe, and N represents at least one member selected from the group consisting of $Eu^{2+}$, $Mn^{2+}$, $Tb^{3+}$, $Yb^{2+}$ and $Tm^{3+}$.

In the present example embodiment, the silicate phosphor 150 is uniformly dispersed in the sealing member 140. Alternatively, the silicate phosphor 150 may be densely disposed adjacent to a surface of the sealing member 140 or adjacent the light source 130 to improve an emission efficiency, etc.

The silicate phosphor 150 is excited by the excitation light L2 to emit a yellow light, a green light, a yellowish red light, and the like. The lights emitted by the silicate phosphor 150 are mixed with the blue light of the excitation light L2. Therefore, the light L1 emitted by the light-emitting device 110 may be a white light as perceived by an observer.

The silicate phosphor of the light-emitting device according to an example embodiment of the present invention has a substantially maximum absorbance for a wavelength of about 450 nm to about 475 nm corresponding to a main part of the excitation light, and has a great stability at a high temperature. Thus, the silicate phosphor has a high emission efficiency, and a luminance at a high temperature more than about 200° C. may be maintained to be more than about 60% when a luminance at a room temperature is defined as 100%. Furthermore, a doping ratio of the activator to the host lattice may be adjusted so that various white lights including from a warm white light to a cold white light may be selectively generated. Thus, a stability and a display quality of the light-emitting device and the display device may be improved.

Hereinafter, the silicate phosphor and the method of manufacturing the silicate phosphor will be explained with reference to particular examples.

EXAMPLE 1

$CaCO_3$, $SiO_2$ and $Ce_2O_3$ were measured and mixed with each other such that the mole ratio of $CaCO_3$, $SiO_2$ and $Ce_2O_3$ was about 1.97:1:0.015 respectively. An obtained mixture was disposed in a melting pot, and the melting pot was disposed in an electronic furnace. Thereafter, the mixture was sintered at about 1,450° C. for about 4 hours under about 1 atm with a mixture gas including a hydrogen gas and a nitrogen gas with a volume ratio of about 5:95. Thereafter, the mixture was cooled at about 15° C./min to have a room temperature to obtain a crystallized silicate phosphor composition. The silicate phosphor was uniformly crushed through a ball milling to form a silicate phosphor powder.

Figure 4:
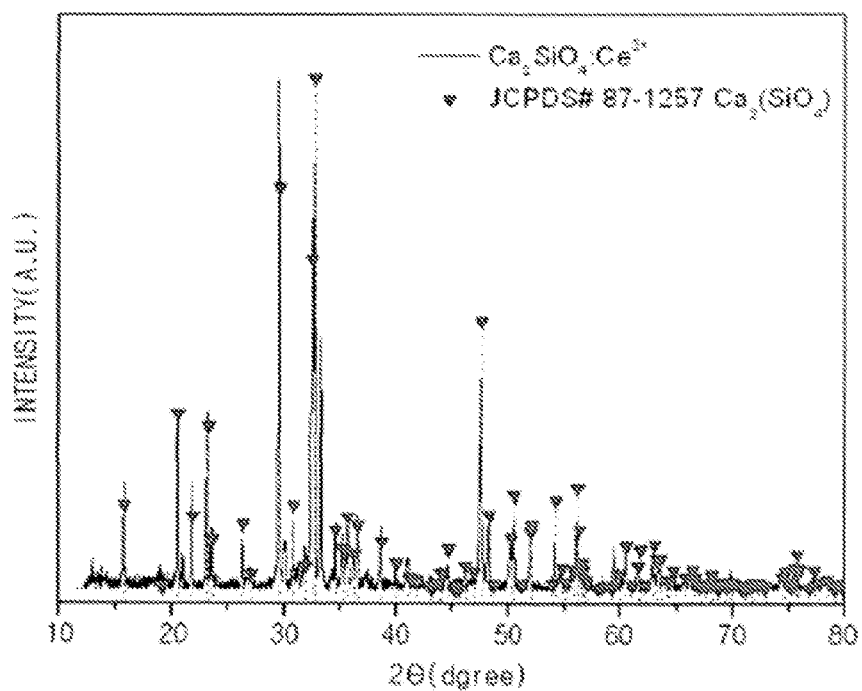
FIG. 4 is an X-ray diffraction (XRD) graph of Example 1.

FIG. 4 is an X-ray diffraction (XRD) graph of Example 1. Referring to FIG. 4, a powder diffraction pattern of the silicate phosphor of Example 1 coincides with a powder diffraction pattern of a standard material according to JCPDS #87-1257. Thus, it can be noted that the silicate phosphor of Example 1 has a γ-phase of an orthorhombic crystal structure with the space group being Pbnm 62, and is represented by $Ca_{1.97}SiO_4:0.03Ce^{3+}$.

Figure 5:
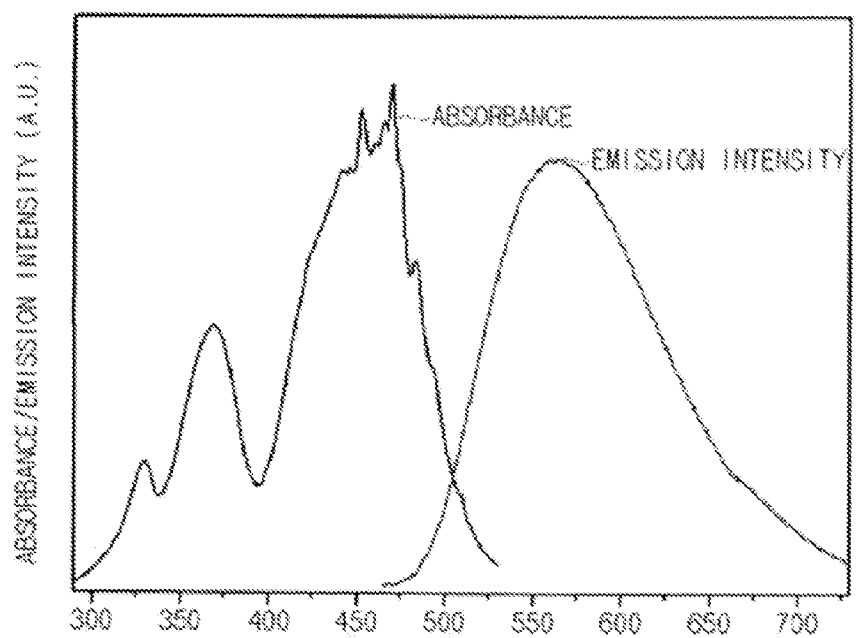
FIG. 5 is a graph showing an emission spectrum and an absorbance spectrum of the silicate phosphor of Example 1.

FIG. 5 is a graph showing an emission spectrum and an absorbance spectrum of the silicate phosphor of Example 1. Referring to FIG. 5, the silicate phosphor of Example 1 has a substantially maximum absorbance for wavelengths of about 450 nm to about 475 nm. Thus, it can be noted that the silicate phosphor of Example 1 strongly absorbs a light generated by a blue LED to responsively emit a visible ray near about 560 nm, such as a yellow light, a green light, a yellowish red light and the like.

Figure 6:
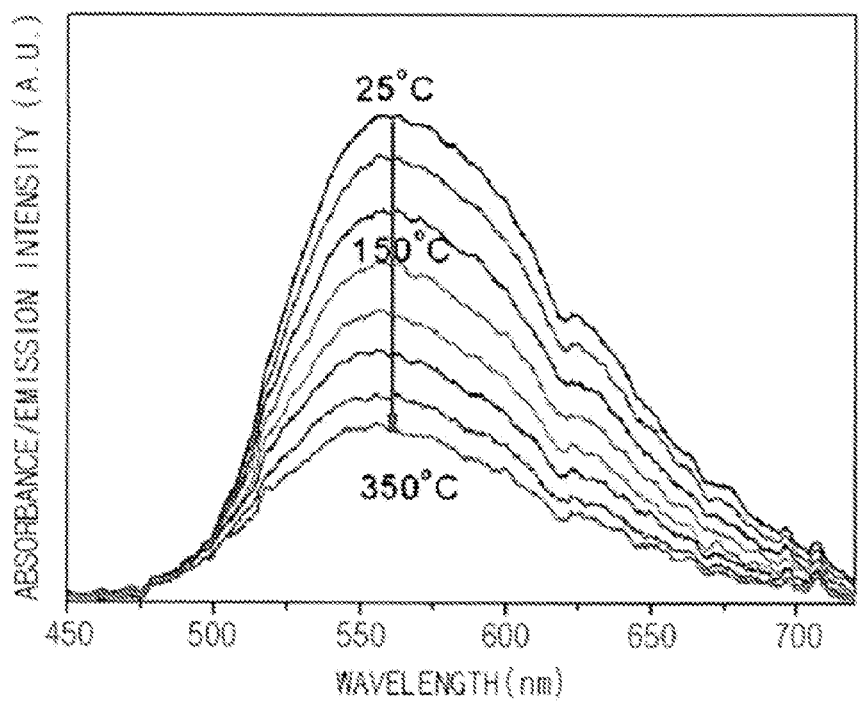
FIG. 6 is a graph showing an emission spectrum depending on a temperature of the silicate phosphor of Example 1.
Figure 7:
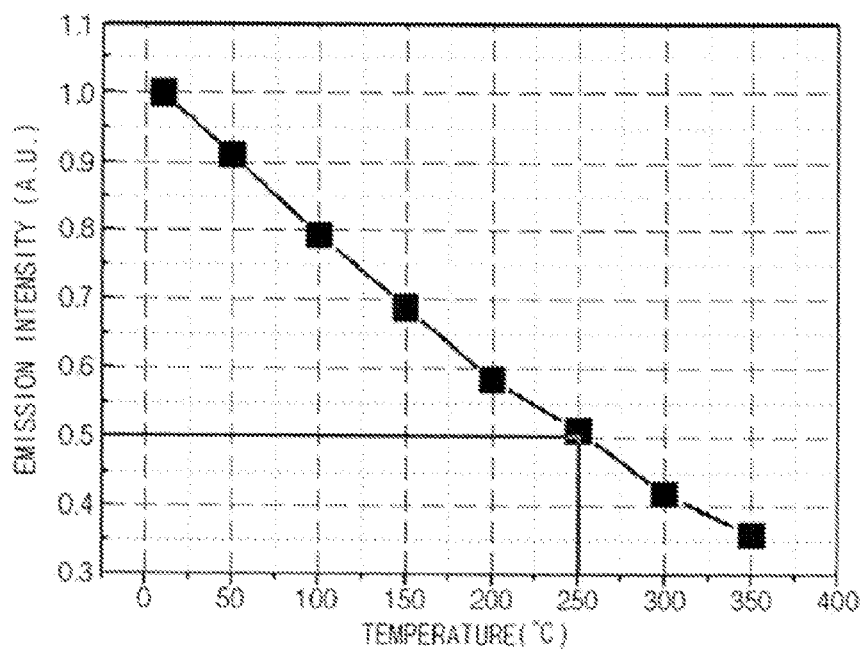
FIG. 7 is a graph showing a luminance variation depending on a temperature of the silicate phosphor of Example 1.

FIG. 6 is a graph showing an emission spectrum depending on a temperature of the silicate phosphor composition of Example 1, and FIG. 7 is a graph showing a luminance variation depending on a temperature of the silicate phosphor composition of Example 1.

Referring to FIG. 6, a maximum emission wavelength of the silicate phosphor of Example 1 is about 560 nm at about 25° C., about 558 nm at about 150° C., and about 556 nm at about 350° C. Thus, since variation of the maximum emission wavelength of the silicate phosphor of Example 1 is no more than about 4 nm, it can be noted that the silicate phosphor of Example 1 has a relatively stable emission characteristic. Since the silicate phosphor of Example 1 has a γ-phase of an orthorhombic crystal structure with space group being Pbnm 62, it is believed that a heat-vibration of its host lattice is reduced, and a time for an emission transition of $Ce^{3+}$ ion is relatively small. Thus, the silicate phosphor of Example 1 is capable of providing a color stability at a high temperature so that a color change due to a heat generated by an adjacent light-emitting device (e.g., a blue light and/or UV light emitting LED), when the light-emitting device is driven for a long time or intensely, is reduced.

Referring to FIG. 7, a quenching temperature, which correspond to 50% of an emission intensity at a room temperature, of the silicate phosphor of Example 1 is about 250° C. In contrast, a known quenching temperature of a conventional silicate phosphor doped with $Eu^{2+}$ ion and having one or more of the α, β, χ or T phases is about 150° C., and a known quenching temperature of a conventional YAG:Ce phosphor having a garnet crystal structure is about 225° C. Thus, it can be noted that the silicate phosphor of Example 1 may have a greater stability at a high temperature when compared to the conventional silicate phosphor and the conventional YAG:Ce phosphor.

Therefore, a silicate phosphor composition according to an example embodiment of the present disclosure of invention has a relatively good color stability and a relatively good emission stability at elevated temperatures such as up to as high as at least 350° C. Furthermore, the silicate phosphor may be used together with LED's (e.g., blue and/or UV emitting LED's) for providing a general purpose white light illumination device as well as a backlighting unit of a display device that may be required to provide a specific warm or cold white light.

EXAMPLE 2

$CaCO_3$, $SiO_2$ and $Ce_2O_3$ were measured and mixed with each other such that the mole ratio of $CaCO_3$, $SiO_2$ and $Ce_2O_3$ was about 1.99:1:0.005 respectively. A silicate phosphor was obtained from the mixture through a method substantially the same as Example 1. The silicate phosphor had a γ-phase of an orthorhombic structure with space group being Pbnm 62, which was represented by $Ca_{1.99}SiO_4:0.01Ce^{3+}$.

EXAMPLE 3

$CaCO_3$, $SiO_2$ and $Ce_2O_3$ were measured and mixed with each other such that the mole ratio of $CaCO_3$, $SiO_2$ and $Ce_2O_3$ was about 1.98:1:0.01 respectively. A silicate phosphor was obtained from the mixture through a method substantially the same as Example 1. The silicate phosphor had a γ-phase of an orthorhombic structure with space group being Pbnm 62, which was represented by $Ca_{1.98}SiO_4: 0.02Ce^{3+}$.

EXAMPLE 4

$CaCO_3$, $SiO_2$ and $Ce_2O_3$ were measured and mixed with each other such that the mole ratio of $CaCO_3$, $SiO_2$ and $Ce_2O_3$ was about 1.96:1:0.02 respectively. A silicate phosphor was obtained from the mixture through a method substantially the same as Example 1. The silicate phosphor had a γ-phase of an orthorhombic structure with space group being Pbnm 62, which was represented by $Ca_{1.96}SiO_4:0.04Ce^{3+}$.

EXAMPLE 5

$CaCO_3$, $SiO_2$ and $Ce_2O_3$ were measured and mixed with each other such that the mole ratio of $CaCO_3$, $SiO_2$ and $Ce_2O_3$ was about 1.95:1:0.025 respectively. A silicate phosphor was obtained from the mixture through a method substantially the same as Example 1. The silicate phosphor had a γ-phase of an orthorhombic structure with space group being Pbnm 62, which was represented by $Ca_{1.95}SiO_4:0.05Ce^{3+}$.

Figure 8:
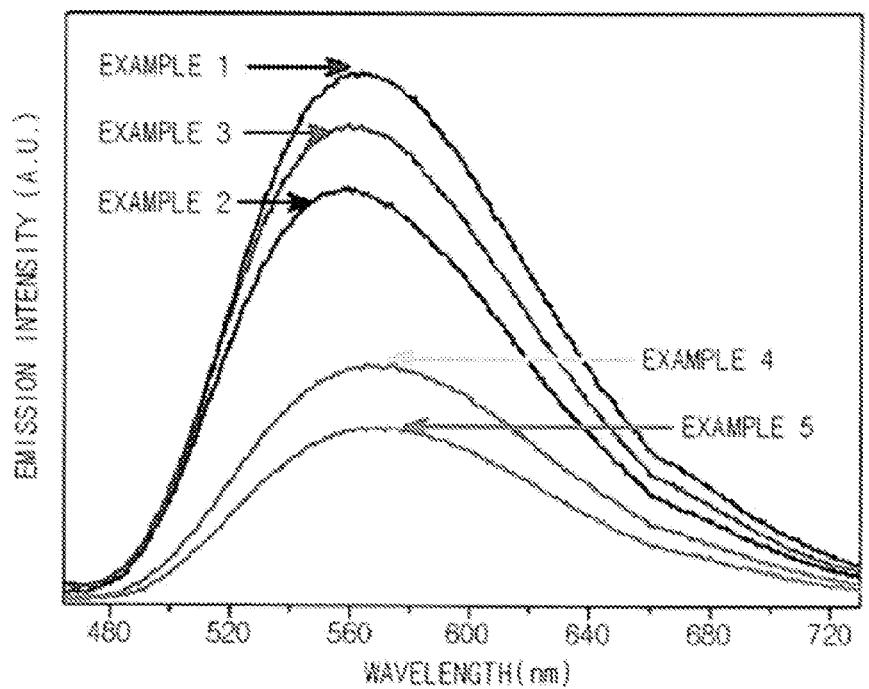
FIG. 8 is a graph showing emission spectrums of silicate phosphors according to Examples 1 to 5.

FIG. 8 is a graph showing emission spectrums of silicate phosphors manufactured respectively according to Examples 1 to 5. More particularly, FIG. 8 shows emission spectrums of the respective silicate phosphors in response to an excitation light having a wavelength of about 450 nm.

Referring to FIG. 8, as $Ce^{3+}$ ion concentration in the composition increases, an emission intensity increases so that the silicate phosphor of Example 1, which includes 0.03 mole of $Ce^{3+}$ ion, has a highest emission intensity. However, the silicate phosphors of Examples 4 and 5, which include $Ce^{3+}$ ion more than 0.03 mole by comparison, have reduced emission intensities when compared to the silicate phosphor of Example 1 including 0.03 mole of $Ce^{3+}$ ion in the given mole ratio. When an activator with more than a predetermined content is doped into the host lattice of the silicate phosphor composition, an emission intensity may be reduced due to an intra-action of the activator and the lattice. Thus, it can be noted that a content of $Ce^{3+}$ ion in a silicate phosphor according to an example embodiment of the present invention is preferably about 0.01 mole to about 0.03 mole with respect to about 1 mole of $SiO_4$.

EXAMPLE 6

$CaCO_3$, $BaCO_3$, $SiO_2$ and $CeO_2$ were measured and mixed with each other such that the mole ratio of $CaCO_3$, $BaCO_3$, $SiO_2$ and $CeO_2$ was about 1.92:0.05:1:0.03 respectively. A silicate phosphor was obtained from the mixture through a method substantially the same as Example 1. The silicate phosphor had a γ-phase of an orthorhombic structure with space group being Pbnm 62, which was represented by $Ca_{1.92}Ba_{0.05}SiO_4:0.03Ce^{3+}$.

EXAMPLE 7

$CaCO_3$, $BaCO_3$, $SiO_2$ and $CeO_2$ were measured and mixed with each other such that the mole ratio of $CaCO_3$, $BaCO_3$, $SiO_2$ and $CeO_2$ was about 1.87:0.1:1:0.03 respectively. A silicate phosphor was obtained from the mixture through a method substantially the same as Example 1. The silicate phosphor had a γ-phase of an orthorhombic structure with space group being Pbnm 62, which was represented by $Ca_{1.87}Ba_{0.1}SiO_4:0.03Ce^{3+}$.

EXAMPLE 8

$CaCO_3$, $BaCO_3$, $SiO_2$ and $CeO_2$ were measured and mixed with each other such that the mole ratio of $CaCO_3$, $BaCO_3$, $SiO_2$ and $CeO_2$ was about 1.82:0.15:1:0.03 respectively. A silicate phosphor was obtained from the mixture through a method substantially the same as Example 1. The silicate phosphor had a γ-phase of an orthorhombic structure with space group being Pbnm 62, which was represented by $Ca_{1.82}Ba_{0.15}SiO_4:0.03Ce^{3+}$.

EXAMPLE 9

$CaCO_3$, $BaCO_3$, $SiO_2$ and $CeO_2$ were measured and mixed with each other such that the mole ratio of $CaCO_3$, $BaCO_3$, $SiO_2$ and $CeO_2$ was about 1.77:0.2:1:0.03 respectively. A silicate phosphor was obtained from the mixture through a method substantially the same as Example 1. The silicate phosphor had a γ-phase of an orthorhombic structure with space group being Pbnm 62, which was represented by $Ca_{1.77}Ba_{0.2}SiO_4:0.03Ce^{3+}$.

Figure 9:
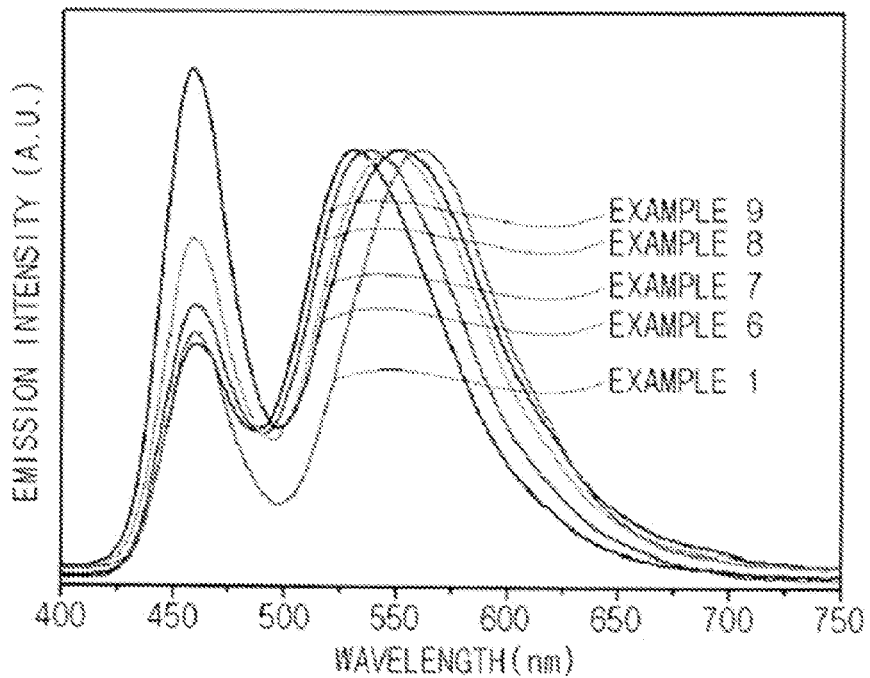
FIG. 9 is a graph showing emission spectrums of silicate phosphors according to Examples 1 and 6 to 9.

FIG. 9 is a graph showing emission spectrums of silicate phosphors manufactured according to Examples 1 and 6 to 9. Referring to FIG. 9, as a relative content of Ba ions increases in the composition, a maximum intensity wavelength in a yellow light region moves from about 560 nm to about 530 nm toward a blue light region. Since the silicate phosphors of Examples 6 to 9 include Ba ions substituted for Ca ions, an intensity of a crystal field is changed. Thus, an energy band of $Ce^{3+}$ ion is changed so that an emission spectrum of a silicate phosphor is changed. Thus, Mg, Sr, Ba, Zn, Na, Al, Ga, Ge, P, As or Fe may be similarly substituted for Ca within a predetermined range of chemical solubility, in which a basic crystal structure of the silicate phosphor is not changed, so as to thereby selectively change the emission spectrum of the silicate phosphor according to the needs of different applications.

EXAMPLE 10

Figure 10:
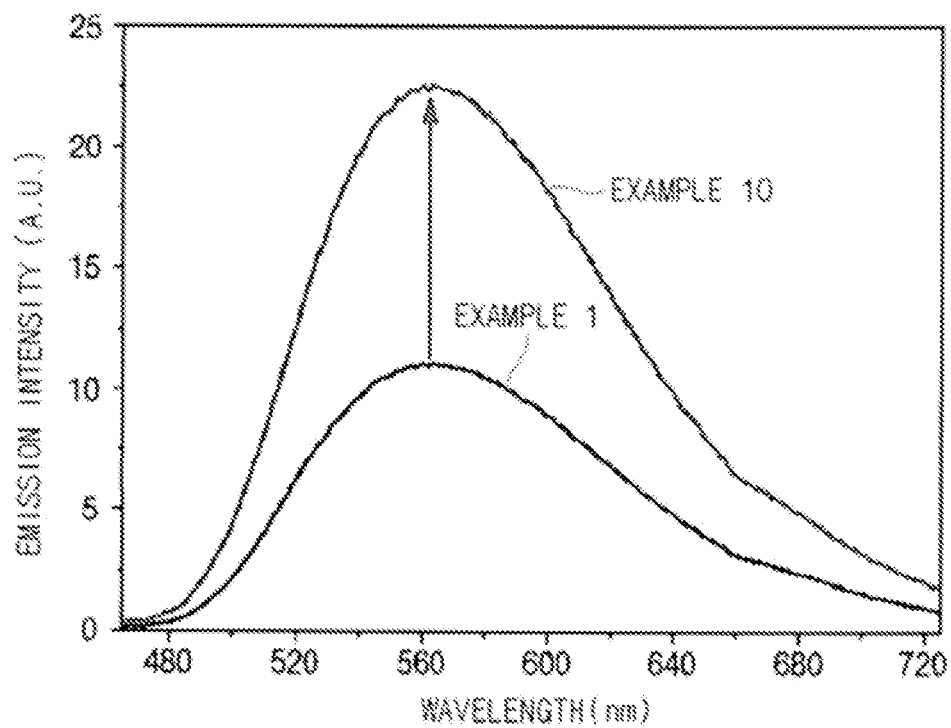
FIG. 10 is a graph shows emission spectrums of the silicate phosphor of Examples 1 and 10.

$CaCO_3$, $SiO_2$ and $Ce_2O_3$ and $BaF_2$ were measured and mixed with each other such that the mole ratio of $CaCO_3$, $SiO_2$ and $Ce_2O_3$ and $BaF_2$ was about 1.97:1:0.015:0.0423 respectively. A silicate phosphor was obtained from the mixture through a method substantially the same as Example 1. The silicate phosphor had a γ-phase of an orthorhombic structure with space group being Pbnm 62, which was represented by $Ca_{1.97}SiO_4:0.03Ce^{3+}$. An average particle size of the silicate phosphor of Example 1 before being treated through a ball milling process was about 10 um, and an average particle size of the silicate phosphor of Example 10, which was obtained from the mixture including $BaF_2$ as a flux, was about 30 um FIG. 10 is a graph shows emission spectrums of the silicate phosphor of Examples 1 and 10. Referring to the plots of FIG. 10, it can be noted that a maximum emission intensity of the silicate phosphor of Example 10 is two-time greater than that of the silicate phosphor of Example 1. A melting temperature of $BaF_2$ is about 1,368° C., which is lower than melting temperatures of other elements of the raw-materials mixture. Thus, $BaF_2$ may be melted prior to the other elements of the raw-material mixture to improve a flexibility and liquidity of the raw-material mixture and to promote growth of a crystal having a γ-phase of an orthorhombic structure with space group being Pbnm 62. Thus, an emission luminance of a silicate phosphor may be improved by including $BaF_2$.

EXAMPLE 11

The silicate phosphor of Example 1 was uniformly mixed with a transparent epoxy resin. The epoxy resin with the silicate phosphor was coated on a GaN-based blue LED to manufacture a white light-emitting device.

As a result of experiments, the white light-emitting device of Example 11 had an X coordinate of 0.3592 and a Y coordinate of 0.3816 on a standard CIE chromaticity coordinates, and had a color temperature of about 4641K, which was near a warm white light, and had a relatively high color purity. Furthermore, a color rendering index of the white light-emitting device of Example 11 was 87 while a color rendering index of a conventional YAG-based white light-emitting device using the same blue LED and the same epoxy resin as the white light-emitting device of Example 11 is 80. Thus, it can be noted that the white light-emitting device of Example 11 may have an improved color rendering index when compared to the conventional YAG-based white light-emitting device and that the white light-emitting device of Example 11 may provide a light in a wide wavelength range covering from a green light to a red light, which cannot be provided by the conventional YAG-based white light-emitting device.

The foregoing is illustrative of embodiments in accordance with the present disclosure of invention and is not to be construed as limiting the teachings of the present disclosure. Although a few example embodiments have been described, those skilled in the art will readily appreciate in light of the foregoing that many modifications are possible in the example embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also functionally equivalent structures. Therefore, it is to be understood that the foregoing is illustrative of the present invention and is not to be construed as limited to the specific example embodiments disclosed herein.

What is claimed is:

1. A silicate phosphor having a γ-phase of an orthorhombic crystal structure of a Pbnm 62 space group, and being represented by the following Chemical Formula 1, $$Ca_{2-x-y-z}M_xSiO_4:yCe^{3+},zQ (0 \le x < 0.5, 0 < y \le 0.1, 0 \le z < 0.15)$$ <Chemical Formula 1> wherein M represents at least one member selected from the group consisting of Mg, Sr, Ba, Zn, Na, Al, Ga, Ge, P, As and Fe, and Q represents at least one member selected from the group consisting of $Eu^{2+}$, $Mn^{2+}$, $Tb^{3+}$, $Yb^{2+}$ and $Tm^{3+}$.

2. The silicate phosphor of claim 1, wherein a content of Ca is equal to or greater than about 1.25 mole and less than about 2 mole with respect to 1 mole of $SiO_4$.

3. The silicate phosphor of claim 1, wherein a powder diffraction pattern of the silicate phosphor coincides with JCPDS standard #76-0799, #77-0387, #86-0397, #87-1256, #87-1257 or #83-2457.

4. The silicate phosphor of claim 1, wherein a mole content of $Ce^{3+}$ is about 0.01 mole to about 0.03 mole with respect to 1 mole of $SiO_4$.

5. A method of manufacturing a silicate phosphor, the method comprising:
preparing a raw-materials mixture including a Ca-containing compound, a Si-containing compound and a Ce-containing compound;
sintering the raw-material mixture; and
cooling the sintered raw-material mixture to obtain a solidified silicate phosphor having a γ-phase of an orthorhombic crystal structure whose space group is Pbnm 62, and whose composition is represented by the following Chemical Formula 1, $$Ca_{2-x-y-z}M_xSiO_4:yCe^{3+},zQ (0 \le x < 0.5, 0 < y \le 0.1, 0 \le z < 0.15)$$ <Chemical Formula 1> wherein M represents at least one member selected from the group consisting of Mg, Sr, Ba, Zn, Na, Al, Ga, Ge, P, As and Fe, and Q represents at least one member selected from the group consisting of $Eu^{2+}$, $Mn^{2+}$, $Tb^{3+}$, $Yb^{2+}$ and $Tm^{3+}$, and
wherein the sintered raw-material mixture is cooled by a temperature ramp down speed of no less than about 15° C./min.

6. The method of claim 5, wherein the Ca-containing compound includes at least one selected member from the group consisting of CaO, $CaCO_3$, $Ca(NO_3)_2$, $CaF_2$ and $CaCl_2$, and the Si-containing compound includes at least one member selected from the group consisting of $SiO_2$, SiO and Si, and the Ce-containing compound includes at least one member selected from the group consisting of $Ce_2O_3$, $CeO_2$, $Ce_2(SO_4)_3$ and $Ce(SO_4)_2$.

7. The method of claim 5, wherein the raw-material mixture further includes at least one compound containing Mg, Sr, Ba, Zn, Na, Al, Ga, Ge, P, As or Fe, and further includes at least one compound containing Eu, Mn, Tb, Yb or Tm.

8. The method of claim 5, wherein the raw-material mixture further includes a flux including at least one member selected from the group consisting of $MgF_2$, $MgCl_2$, $BaF_2$, $BaCl_2$, $SrF_2$, $SrCl_2$, $CaF_2$, $CaCl_2$, $NH_4F$, $NH_4Cl$ and LiF.

9. The method of claim 5, wherein the raw-material mixture is sintered at about 1,350° C. to about 1,550° C.

10. The method of claim 9, wherein the raw-material mixture is sintered in a reducing atmosphere including a hydrogen gas.

11. The method of claim 9, wherein the raw-material mixture is sintered under a pressure of about 0.05 atm to about 2.5 atm.

12. The method of claim 5, wherein the sintered raw-material mixture is cooled during the temperature ramp down to have a temperature less than about 25° C.

13. The method of claim 5, wherein the sintered raw-material mixture is cooled by a temperature ramp down speed of no less than about 45° C./min.

14. The method of claim 5, further comprising crushing the solidified silicate phosphor.

15. A light-emitting device comprising:
a light source structured for generating at least an excitational light having a predetermined excitational wavelength; and
a silicate phosphor disposed to be excited by the excitational light to responsively emit a light having a wavelength longer than the predetermined excitational wavelength, the silicate phosphor having a γ-phase of an orthorhombic crystal structure whose space group is Pbnm 62, and whose composition is represented by the following Chemical Formula 1, $$Ca_{2-x-y-z}M_xSiO_4:yCe^{3+},zQ (0 \le x < 0.5, 0 < y \le 0.1, 0 \le z < 0.15)$$ <Chemical Formula 1> wherein M represents at least one member selected from the group consisting of Mg, Sr, Ba, Zn, Na, Al, Ga, Ge, P, As and Fe, and Q represents at least member one selected from the group consisting of $Eu^{2+}$, $Mn^{2+}$, $Tb^{3+}$, $Yb^{2+}$ and $Tm^{3+}$.

16. The light-emitting device of claim 15, wherein the light source includes an LED generating a blue light.

17. The light-emitting device of claim 16, wherein the silicate phosphor emits at least one light selected from the group consisting of a yellow light, a green light and a yellowish red light.

18. The light-emitting device of claim 15, wherein the light generated by the light source is combined with the light emitted by the silicate phosphor thereby forming a white light.

19. The light-emitting device of claim 15, further comprising a sealing member attached to or incorporating the silicate phosphor and covering the light source.

* * * * *